United States Patent [19]

Lonergan et al.

[11] Patent Number: 5,608,322
[45] Date of Patent: Mar. 4, 1997

[54] METHOD OF AND APPARATUS FOR OBTAINING NMR INFORMATION

[75] Inventors: Andrew R. Lonergan, London; Peter J. McDonald, Surrey, both of England

[73] Assignee: British Technology Group Limited, London, England

[21] Appl. No.: 244,456

[22] PCT Filed: Jan. 12, 1993

[86] PCT No.: PCT/GB93/00051

§ 371 Date: Jun. 2, 1994

§ 102(e) Date: Jun. 2, 1994

[87] PCT Pub. No.: WO93/14415

PCT Pub. Date: Jul. 22, 1993

[30] Foreign Application Priority Data

Jan. 13, 1992 [GB] United Kingdom .................. 9200629

[51] Int. Cl.$^6$ ..................................................... G01V 3/00
[52] U.S. Cl. ........................... 324/309; 324/307; 324/314
[58] Field of Search ................................... 324/307, 309, 324/312, 314

[56] References Cited

U.S. PATENT DOCUMENTS

| | | | |
|---|---|---|---|
| 4,680,545 | 6/1987 | Gray et al. | 324/307 |
| 4,771,242 | 10/1988 | Lampman et al. | 324/309 |
| 5,327,085 | 6/1994 | Cory et al. | 324/307 |

FOREIGN PATENT DOCUMENTS

| | | |
|---|---|---|
| 0379802 | 8/1990 | European Pat. Off. |
| 2139764 | 11/1984 | United Kingdom. |

*Primary Examiner*—Sandra L. O'Shea
*Assistant Examiner*—Mark Haynes
*Attorney, Agent, or Firm*—Nixon & Vanderhye

[57] ABSTRACT

Spatial NMR information is obtained from a sample by applying a magnetic field having a static component and two orthogonal periodically-varying gradient components. A recurring cycle of rf excitation pulses is applied. One of the gradient components is reduced in amplitude from its maximum to zero over a period and the other gradient component is subsequently increased from zero to its maximum over a period. The said periods are both longer than the cycle time.

9 Claims, 3 Drawing Sheets

METHOD OF AND APPARATUS FOR OBTAINING NMR INFORMATION

This Invention relates to a method of and apparatus for obtaining nuclear magnetic resonance information from a sample, and more particularly from a solid or other sample having a short spin-spin relaxation time ($T_2$). $T_2$ may, for example, be less than 100, 500 or 800 μs.

BACKGROUND OF THE INVENTION

Hitherto in solid state imaging, images have conventionally been reconstructed from profiles using back projection algorithms. The essence of back projection is the use of just one magnetic field gradient in the profile direction. A common way to obtain a profile is to record the free induction decay signal or echo as a function of time in the presence of a gradient which is linear in space and then to Fourier transform the decay signal or echo. This procedure is commonly known as frequency encoding. The gradient is rotated and the experiment repeated until sufficient profiles are available for an image to be constructed using back projection algorithms. In the (reciprocal) k-space description of NMR imaging which has now been widely adopted as the means of describing NMR imaging techniques, data is recorded radially outwards from the centre of k-space. An alternative to frequency encoding is phase encoding, where the angle through which a spin precesses during a fixed encoding time is recorded as a function of gradient strength. A useful review paper on back projection techniques has been written by P. Mansfield and is entitled "Imaging by Nuclear Magnetic Resonance" (J. Phys. E. Sci. Instrum., 21 (1988) 18–30).

Although back projection methods have been conventionally used in solid state NMR imaging, it would be advantageous to use two dimensional Fourier transform (2DFT) techniques since these might be expected to lead to an improvement in image quality. 2DFT techniques have been used with great success in liquid state NMR imaging (see, for example, the paper by A. Kumar, D. Welti and R. R. Ernst in J. Magn. Reson. 18 (1975) 69).

The essence of such 2DFT techniques is a period of phase (or less often frequency) encoding in one direction followed immediately by a period of frequency encoding in an orthogonal direction during which the data is read out. The experiment is repeated for incremented values of the phase gradient. k-space is sampled on a rectilinear grid of points allowing reconstruction of the image by two dimensional Fourier Transformation. The improvement in image quality for liquid state NHR imaging has been found to be substantial, partly because k-space is covered more uniformly and partly because the image reconstruction is far less susceptible to artifacts and noise in the data set. In particular star and streak artifacts common in back projection are largely eliminated.

2DFT methods are in general more experimentally complex than back projection methods, because during the course of one free induction decay the phase encode gradient has to be switched off, to be replaced by the frequency encode gradient. For back projection methods, a single frequency encode gradient on throughout the experiment is sufficient. One problem associated particularly with the NHR imaging of the solid state using 2DFT methods is that it is difficult to switch magnetic field gradients sufficiently rapidly to avoid losing useful imaging information. This problem arises from the short spin-spin relaxation times ($T_2$) usually associated with the solid state, which force the use of short encoding times. Not surprisingly this has limited the use of 2DFT methods whilst favouring the development of back projection methods.

An attempt to develop solid state imaging experiments using 2DFT methods has been made by Chingas et al. (J. Hagn. Reson. 66(1986) 530). A line narrowing sequence was used to hold up the magnetisation whilst first a static phase encoding gradient and then a static frequency encoding gradient was applied. In order to avoid artifacts accumulating during the period in which the gradients were switched over, the magnetisation was stored along a magic angle direction by the introduction of appropriate storage and retrieval rf pulses before and after the changeover. In principle this is a good procedure which can additionally provide an image contrast mechanism. However it requires considerable experimental skill to set it up accurately, especially as the storage and retrieval pulses in the experiment of Chingas et al. were π/4 rather than π/2 rotations.

SUMMARY OF THE INVENTION

The present invention seeks to overcome the above problems encountered in NMR imaging of the solid state using 2DFT methods.

According to the present invention, there is provided a method of obtaining NMR information from a sample, comprising:

providing means for producing a magnetic field in the sample;

energising the production means to produce a static field component and to produce first and second gradient field components in first and second directions respectively for the encoding of two-dimensional spatial information about the sample;

applying at least one high frequency excitation pulse to the sample to excite selected nuclei therein; and detecting the spatially encoded NMR signal from the sample resulting from the or each excitation pulse;

characterised by:.

energising the production means such that the energisation for the first gradient field component is reduced in amplitude to zero sufficiently smoothly and slowly and such that the energisation for the second gradient field component is subsequently increased in amplitude from zero sufficiently smoothly and slowly, that spurious eddy current fields do not appreciably distort the spatially encoded NMR signal.

By "modulating" or "shaping" the first and second gradient field component amplitudes in this way so that spurious eddy current fields do not distort the spatially encoded NMR signal, the need for storage of the magnetisation during the switching between the first and the second components can be obviated. Furthermore, the actual switching between the energisation for one component and that for the other component can be almost instantaneous (although of course the shaping employed can mean that the maximum values of the two components are spaced apart by an appreciable interval).

To understand the present invention more clearly, it is necessary to appreciate that eddy current fields will invariably be present when the energisation for the gradient fields is fluctuating. For example, a sinusoidally varying energisation of constant amplitude will cause a sinusoidally varying eddy current field which follows in shape the energisation waveform. This eddy current field can be characterised as a phase shift to the phase of the energisation waveform, and appropriate allowances can be made for this phase shift in, say, the timing of the excitation pulses with respect to the waveform. On the other hand, an overly rapid change in the energisation (such as the cut-on or cut-off of a static gradient) would cause spurious eddy current fields (such as overshoots or non-periodic oscillations) which could not be characterised in such a way. Such spurious eddy current fields could in turn seriously distort the spatially encoded NHR signal in ways which, again, could not be characterised. The present invention provides that such distortions do not occur to an appreciable extent.

It will be appreciated that, in putting the invention into effect, it is typically necessary to ensure that the shaping is sufficiently smooth and slow that the eddy current filed follows in shape the energisation waveform, that is, that the ratio in instantaneous magnitudes between the eddy current filed and the energisation waveform remains roughly constant, albeit that the two waveforms may not be in phase. In this way, the eddy current field can remain characterised.

The period over which the energisation for the first and second components is reduced in amplitude from its maximum value to zero or increased in amplitude from zero to its maximum value is dependent on the damping time of the eddy current field. It has been found that, generally, distortion of the spatially encoded NNR signal can be avoided if this period is at least as long as, preferably considerably longer than, the damping time.

The shaping should ideally not take place so slowly that only insignificant amounts of imaging information can be gained. The shaping would typically occur over a period which is short in relation to the effective $T_2$ (i.e. the line narrowed $T_2$) of the sample.

If, as is preferred, a recurring cycle of excitation pulses is applied to the sample to cause line narrowing, preferably the period over which the energisation for the first gradient field component is reduced in amplitude from its maximum value to zero and the period over which the energisation for the second gradient field component is increased in amplitude from zero to its maximum value are both longer than (preferably three times, more preferably ten times, longer than) the cycle time. This can ensure that the gradient components are sufficiently constant over each cycle not only to prevent spurious eddy current fields from distorting the spatially encoded NHR signal but also to prevent breakdown of the line narrowing efficiency of the pulse sequence.

It is preferred that the energisation is such as to produce sinusoidally varying first and second gradient field components. Use of a sinusoidally oscillating gradient field has already been disclosed in U.K. Patent Application No. 2234594. Its use in conjunction with the present amplitude shaping technique is advantageous because of its ease of implementation. This is particularly so if the shaping is sinusoidal, since then the required energisation is simply two superposed sine functions of different frequency.

If the energisation is such as to produce periodically varying gradient field components (as may, for example, be required by a particular pulse sequence), the oscillation periods of the first and second gradient field components are preferably, respectively, less than the period (more preferably less than a third of the period) over which the energisation for the first gradient field component is reduced in amplitude from its maximum value to zero and the period over which the energisation for the second gradient field component is increased in amplitude from zero to its maximum value. This may prevent spurious eddy current fields from distorting the spatially encoded NMR signal.

Preferably, the energisation is such that the amplitude of the first gradient field component reduces approximately linearly as it approaches zero and the amplitude of the second gradient field component increases approximately linearly from zero. This is based on the discovery of the present invention that an approximately linear amplitude variation of this type does not affect the sampled data sufficiently for any correction to this data to be required to take account of the variation in amplitude. This discovery is explained in more detail later. More preferably, the energisation is such that the amplitude of the first gradient field component reduces, and the amplitude of the second gradient field component increases, according to a sine or cosine function since a sine (or cosine) function is particularly easy to implement.

The present invention also extends to apparatus for obtaining NMR information from a sample comprising:

means for producing a magnetic field in the sample;

means for energising the production means to produce a static field component and to produce first and second gradient field components in first and second directions respectively for the encoding of two-dimensional spatial information about the sample;

means for applying a recurring cycle of high frequency excitation pulses to the sample to excite selected nuclei therein so as to cause line narrowing, the period over which the energisation for the first gradient field component is reduced in amplitude from its maximum value to zero and the period over which the energisation for the second gradient field component is increased in amplitude from zero to its maximum value both being longer than the cycle time; and means for detecting the spatially encoded NMR signal from the sample resulting from the or each excitation pulse;

characterised in that:

the energising means is arranged such that the energisation for the first gradient field component is reduced in amplitude to zero sufficiently smoothly and slowly and such that the energisation for the second gradient field component is subsequently increased in amplitude from zero sufficiently smoothly and slowly, that spurious eddy current fields do not appreciably distort the spatially encoded NMR signal.

BRIEF DESCRIPTION OF THE DRAWINGS

Apparatus features are provided by the invention analogously to the method features described above.

Preferred features of the invention will now be described, by way of example, with reference to the accompanying drawings, in which.

DETAILED DESCRIPTION OF THE INVENTION

Figure 1:
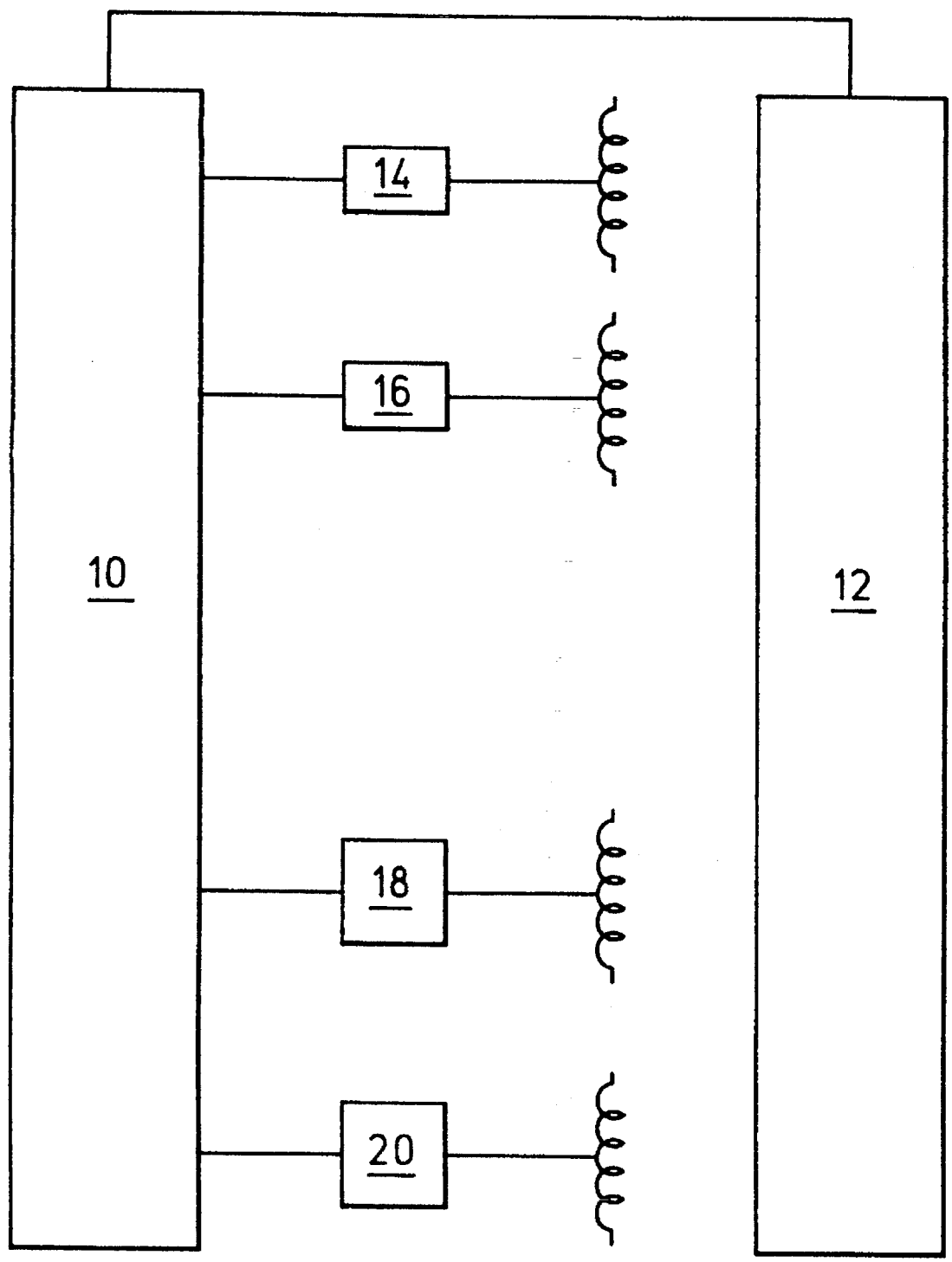
FIG. 1 is a diagrammatic representation of NMR imaging apparatus according to the present invention.

Referring to FIG. 1, NMR imaging apparatus includes a controller 10, which provides power and control for the other components of the apparatus. The apparatus also includes a magnet 12 for producing a static magnetic field in the sample to be imaged, gradient coils 14 and 16 for producing magnetic field gradients $g_x$ and $g_y$ respectively in the x and y directions, an rf transmitter 18, and an rf receiver 20. Apart from certain aspects of the controller 10, the apparatus is conventional and its operation will be well known to the skilled person. It will be appreciated that the controller may in reality consist of various discrete control devices for the various components of the apparatus. In particular, the magnet 12 may be controlled completely separately.

Figure 2:
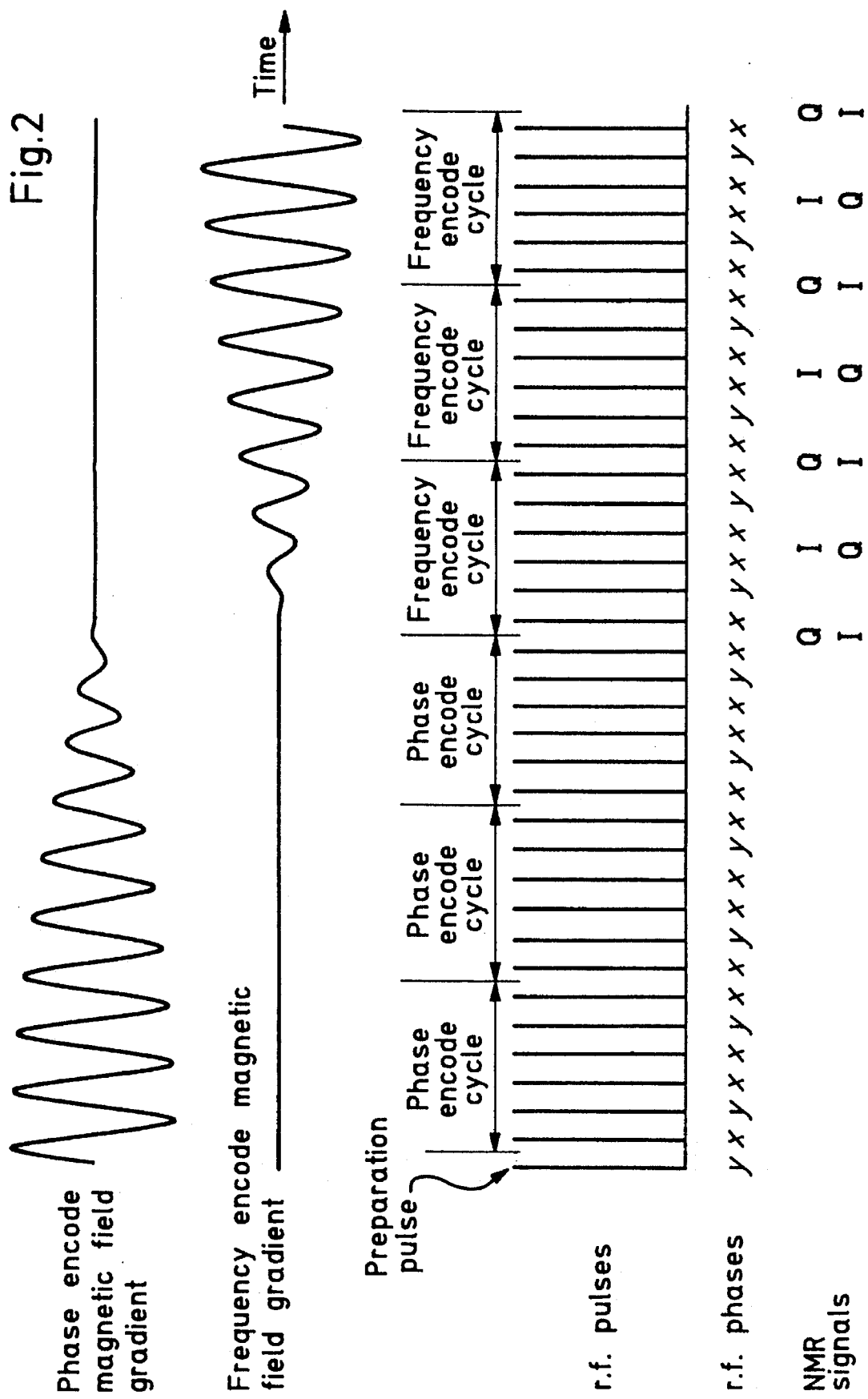
FIG. 2 is a schematic diagram illustrating the rf pulse and magnetic field gradient timing used in the NMR imaging apparatus.

FIG. 2 illustrates how the controller 10 is configured to produce NMR images using a 2DFT method. This figure shows m phase and n frequency encode cycles of a six rf pulse sequence running continuously following an initial rf preparation pulse at time t=O. In the figure m and n are both equal to 3. In a real experiment they are typically much larger. For example, m might typically be 14 and n might be 128. Sinusoidally oscillating phase and frequency encode magnetic field gradients are applied alternately throughout the repeating sequence.

The pulse sequence Illustrated in FIG. 2 is a line narrowing sequence and is as follows:

$$90_{-y}\text{-}\tau\text{-}(90_{-x}\text{-}\tau\text{-}90_{-y}\text{-}\tau\text{-}90_{-x}\text{-}\tau\text{-}90_{-x}\text{-}\tau\text{-}90_{-y}\text{-}\tau\text{-}90_{-x}\text{-}\tau\text{-})_n$$

where the suffixes "-y" and "-x" refer to the rf phase of different pulses of a sequence relative to each other and n (or m) is an integer as defined above. This pulse sequence, and its employment in conjunction with a sinusoidally oscillating frequency encode gradient, is disclosed in more detail in United Kingdom Patent Application No. 2234594 and International Patent Application No. WO 91/00529. The pulse sequence is referred to herein as "zigzag".

N complete shots are required, each with a different value of phase encode magnetic field gradient. The magnetisation is detected stroboscopically during each of the N corresponding frequency encode periods. The frequency of the gradients is $1/(2\tau)$ and the phase is such that the rf pulses occur at gradient zero crossings. This ensures that artifacts due to off resonance pulses are minimised and that spatial encoding is maximised.

As will be apparent from FIG. 2, the transition between the phase encode gradient and the frequency encode gradient is made relatively rapidly. This is achieved by reducing the amplitude of the energisation supplied to the $g_x$ gradient coil 14 throughout the phase encode period from its initial maximum value according to a cosinusoidal modulation so that it is zero at the end of the phase encode period. This effectively prevents spurious eddy currents being produced in the coil after the energisation has been removed. Therefore the phase encode magnetic field gradient ($g_x$) is directly related to the applied energisation, and is given by $$g_x(t) = (2g_o i/N)\sin\left(\frac{\pi t}{\tau}\right)\cos\left(\frac{\pi t}{12m\tau}\right) \quad 0 < t < 6m\tau$$

where $i=-N/2 \ldots (N-1)/2$ is the phase gradient index and $g_o$ is the overall maximum amplitude. It will be appreciated that other modulations aside from the cosine modulation could produce the same desired effect.

The following n cycles of the sequence are run in the presence of an orthogonal frequency encode (or read) magnetic field gradient ($g_y$). This gradient is produced by energisation supplied to the $g_y$ gradient coil 16 whose amplitude starts from zero and increases according to a second cosine modulation. This modulation again effectively prevents spurious overshoots and the like due to eddy currents, so that the frequency encode magnetic field gradient ($g_y$) is directly related to the applied energisation, and is given by $$g_y(t) = g_o\sin\left(\frac{\pi t}{\tau}\right)\cos\left(\frac{\pi(t-6(m-n)\tau)}{12n\tau}\right) \quad 6m\tau < t < 6(m+n)\tau$$

The magnetisation is sampled stroboscopically once in windows $0,6,12\ldots 6n\tau$ of the readout period and also during windows $3,9,15 \ldots (6n-3)\tau$. The only additional requirement needed in order to sample in both the third and sixth window of every cycle is that the quadrature phases of the magnetisation are exchanged for alternate data samplings. This is illustrated in FIG. 2, where "Q" stands for "Quadrature" and "I" stands for "In Phase".

Before the sampled data can be seen as covering a rectilinear grid which can be Fourier Transformed to reveal the two dimensional image, two corrections to the data must be considered.

Firstly, in the original implementation of the zigzag pulse sequence disclosed in UK Patent Application No. 2234594 the gradient amplitude was constant and therefore the effective axis about which the magnetisation precessed was $O_z$. This is not the case with the present invention. With oscillating gradients, the Hamiltonian states for the six pulse sequence are $$(Y, X, \bar{Z}, \bar{X}, \bar{Y}, Z)$$

and these must be weighted according to the instantaneous gradient amplitude. An oscillating magnetic field gradient of stepwise linearly increasing amplitude crudely approximates the cosinusoidal rise of the frequency encode gradient and is given by $$\bar{g}(t) = \begin{array}{ll} +g_o t/6n\tau & (int(t/\tau) \text{ even}) \\ -g_o t/6n\tau & (int(t/\tau) \text{ odd}) \end{array}$$

where the origin of time is redefined as the start of the frequency encode period. For the $P_{th}$ cycle the average effective field to zero order is $$-(g_o/36n)((12p-3)\bar{k}+4\bar{j}+2\bar{i})$$

It is evident from a consideration of the evolution of this field over the first few cycles after start-up that the field quickly establishes itself as effectively in the z direction and of the desired amplitude $$g_o p/3n.$$

Thus negligible precession takes place in the first few cycles when the field is not aligned along the z axis and for this reason there is generally no need to correct the sampled data for this source of systematic error. A similar argument holds for the decreasing phase encode gradient, except that the most affected cycles are the last one or two.

Secondly, the data is recorded at equal time intervals in the presence of an increasing gradient strength so that the data points do not sample k-space uniformly. Before Fourier Transformation a linearisation procedure similar to that used by Ordtdge and Hansfield (U.S. Pat. No. 4509015) must be carried out in which the data is interpolated onto a rectilinear grid in k-space. Denoting the corrected data by primed variables the required correction is $$M'(t) = M\left(\frac{12n\tau}{\pi}\cos^{-1}\left(1-\frac{\pi t}{12n\tau}\right)\right)$$

Once this second correction has been made, a simple 2 dimensional Fourier transform reconstruction algorithm is used to obtain the image. Such an algorithm will be well known to the skilled person.

Figure 3:
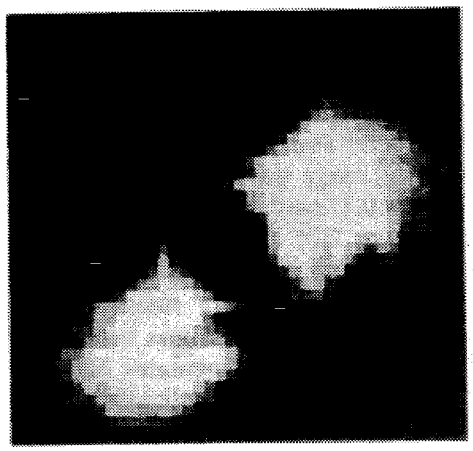
FIG. 3 shows an NMR image obtained using the NMR imaging apparatus.

FIG. 3 shows the NHR image obtained from a phantom of adamantane using the method and apparatus of the present invention. The phantom consisted of two cubic blocks of adamantane measuring 5 mm by 5 mm by 5 mm. The aligned blocks were separated by 3 mm of Teflon (trade mark). The cylindrical symmetry axis of the phantom was oriented in the x=y direction and the $^1$H density of the phantom was imaged in the x–y plane without slice selection. Using the zigzag pulse sequence with a 90° pulse length of 3.5 μs and a pulse gap, τ, of 16 μs to narrow the hydrogen NHR line of adamantane, it was found that significant magnetisation remained after 10 ms. This compares to the normal $T_2$ of less than 100 μs.

The image was obtained using 8 phase encode cycles during which the phase gradient was decreased to zero followed by 128 frequency encode cycles. The frequency encode gradient was increased to maximum amplitude over 15 cycles after which it remained constant. The data analysis was slightly amended in an obvious way from the description above to accommodate this variation. The maximum phase encode gradient amplitude was nominally 25.0 G/cm and the maximum frequency encode gradient amplitude was 2.0 G/cm. However, the phase gradient rolled off non-linearly at a considerably lower amplitude resulting in some loss of resolution and distortion to the image. 64 phase encode steps (i.e. N=64) were used ranging from negative to positive maximum. Data was collected in every third window and the total data set truncated in the frequency direction after Fourier transformation so as to generate an image with a pixel size of approximately 0.45*0.45 mm$^2$ in an image area of 16×16 mm$^2$. The image is the result of 16 averages and took 25 minutes to acquire, although a significant proportion of the time (approximately half) was for data handling for which the fastest technology was not available. The image is shown with only modest, 10%, data windowing top and bottom.

The image compares favourably with images obtained by back projection techniques, and has the advantages to be expected of 2DFT techniques.

It will of course be understood that the present invention has been described above purely by way of example, and modifications of detail can be made within the scope of the invention.

We claim:

1. A method of obtaining NMR information from a solid sample having short spin-spin relaxation time, said method comprising the steps of:

providing production means for producing a magnetic field in the sample;

energizing the production means to produce a static field component and to produce first and second gradient field components in first and second directions respectively for the encoding of two-dimensional spatial information about the sample;

applying at least one high frequency excitation pulse to the sample to excite selected nuclei therein; and detecting the spatially encoded NMR signal from the sample resulting from the or each excitation pulse;

said energizing of the production means being such that the energization of the first gradient field component is reduced in amplitude to zero so as to reduce in amplitude the envelope of the rapidly oscillating gradient and such that the energization of the second gradient field component is subsequently increased in amplitude from zero so as to reduce in amplitude the envelope of the rapidly oscillating gradient whereby spurious eddy current fields do not appreciably distort the spatially encoded NMR signal.

2. A method according to claim 1 wherein a recurring cycle of excitation pulses is applied to the sample to cause line narrowing, the period over which the energisation for the first gradient field component is reduced in amplitude from its maximum value to zero and the period over which the energisation for the second gradient field component is increased in amplitude from zero to its maximum value both being longer than the cycle time.

3. A method according to claim 1 wherein the energisation is such as to produce periodically varying first and second gradient field components, the oscillation periods of these components being, respectively, less than the period over which the energisation for the first gradient field component is reduced in amplitude from its maximum value to zero and less than the period over which the energisation for the second gradient field component is increased in amplitude from zero to its maximum value.

4. A method according to claim 1 wherein the energisation is such that the amplitude of the first gradient field component reduces approximately linearly as it approaches zero and the amplitude of the second gradient field component increases approximately linearly from zero.

5. A method according to claim 4 wherein the energisation is such that the amplitude of the first gradient field component reduces, and the amplitude of the second gradient field component increases, according to a sine or cosine function.

6. Apparatus for obtaining NMR information from a solid sample having a short spin-spin relaxation time comprising:

production means for producing a magnetic field in the sample;

energization means for energizing the production means to produce a static field component and to produce first and second gradient field components in first and second directions respectively for the encoding of two-dimensional spatial information about the sample;

means for applying a recurring cycle of high frequency excitation pulses to sample to excite selected nuclei therein so as to cause line narrowing, the period over which the energization for the first gradient field component is reduced in amplitude from its maximum value to zero and the period over which the energization for the second gradient component is increased in amplitude from zero to its maximum value both being longer than the cycle time; and means for detecting the spatially encoded NMR signal from the sample resulting from the or each excitation pulse;

said energization means being arranged such that the energization for the first gradient field component is reduced in amplitude to zero so as to reduce in amplitude the envelope of the rapidly oscillating gradient and such that the energization for the second gradient field component is subsequently increased in amplitude from zero so as to reduce in amplitude the envelope of the rapidly oscillating gradient whereby spurious eddy current fields do not appreciably distort the spatially encoded NMR signal.

7. Apparatus according to claim 6 wherein the energisation is such as to produce periodically varying first and second gradient field components, the oscillation periods of these components being, respectively, less than the period over which the energisation for the first gradient field component is reduced in amplitude from its maximum value to zero and less than the period over which the energisation for the second gradient field component is increased in amplitude from zero to its maximum value.

8. Apparatus according to claim 6 wherein the energisation is such that the amplitude of the first gradient field component reduces approximately linearly as it approaches zero and the amplitude of the second gradient field component increases approximately linearly from zero.

9. Apparatus according to claim 8 wherein the energisation is such that the amplitude of the first gradient field component reduces, and the amplitude of the second gradient field component increases, according to a sine or cosine function.

* * * * *